(12) United States Patent
Yang et al.

(10) Patent No.: US 10,414,601 B1
(45) Date of Patent: Sep. 17, 2019

(54) AUTOMATIC TURNOVER DEVICE USING GRAVITY

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Wei-Da Yang, New Taipei (TW); Li-Quan Zhang, Shenzhen (CN); Qing Cai, Shenzhen (CN); Zhi-Jun Peng, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/972,209

(22) Filed: May 6, 2018

(30) Foreign Application Priority Data

Mar. 30, 2018 (CN) .......................... 2018 1 0286468

(51) Int. Cl.
*B65G 47/248* (2006.01)
*H05K 3/30* (2006.01)
*B65G 21/20* (2006.01)

(52) U.S. Cl.
CPC ....... *B65G 47/248* (2013.01); *B65G 21/2045* (2013.01); *H05K 3/301* (2013.01); *B65G 2201/022* (2013.01)

(58) Field of Classification Search
CPC ... B65G 47/248; B65G 21/2045; H05K 3/301
USPC .......................................................... 198/382
See application file for complete search history.

(56) References Cited

U.S. PATENT DOCUMENTS 4,039,350 A * 8/1977 Bucy .................... B08B 9/0826
134/22.17

* cited by examiner

*Primary Examiner* — Gene O Crawford
*Assistant Examiner* — Lester Rushin, III
(74) *Attorney, Agent, or Firm* — ScienBiziP, P.C.

(57) ABSTRACT

An automatic turnover device for use in manufacturing includes a support frame, a motor, a pulley, a holding assembly, and a belt. The motor is secured to the support frame. The motor has an output shaft. The pulley is mounted on the output shaft of the motor. The holding assembly is pivotally connected to the support frame. The holding assembly is configured to hold an object. The belt has one end attached to the pulley and another end attached to the holding assembly. The motor is operated to rotate the output shaft in a first direction to tighten the belt and then to rotate in reverse to release the belt, such that a center of gravity of the holding assembly is moved. The holding assembly pivots relative to the support frame from a first horizontal position to a second horizontal position due to its own weight.

20 Claims, 6 Drawing Sheets

AUTOMATIC TURNOVER DEVICE USING GRAVITY

FIELD

The present disclosure relates to manufacturing devices, and more particularly to an automatic turnover device using gravity.

BACKGROUND

A workpiece, such as a circuit board, is turned over by an automatic turnover device to allow the front and back surfaces of the workpiece to be processed during the manufacturing process of the workpiece. Conventional automatic turnover devices include a turnover track. The turnover track is made to turn over such that the workpiece or the fixture with the workpiece on the turnover track is turned over. However, the conventional automatic turnover device has disadvantages such as complex structure, high manufacturing costs, and large size.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
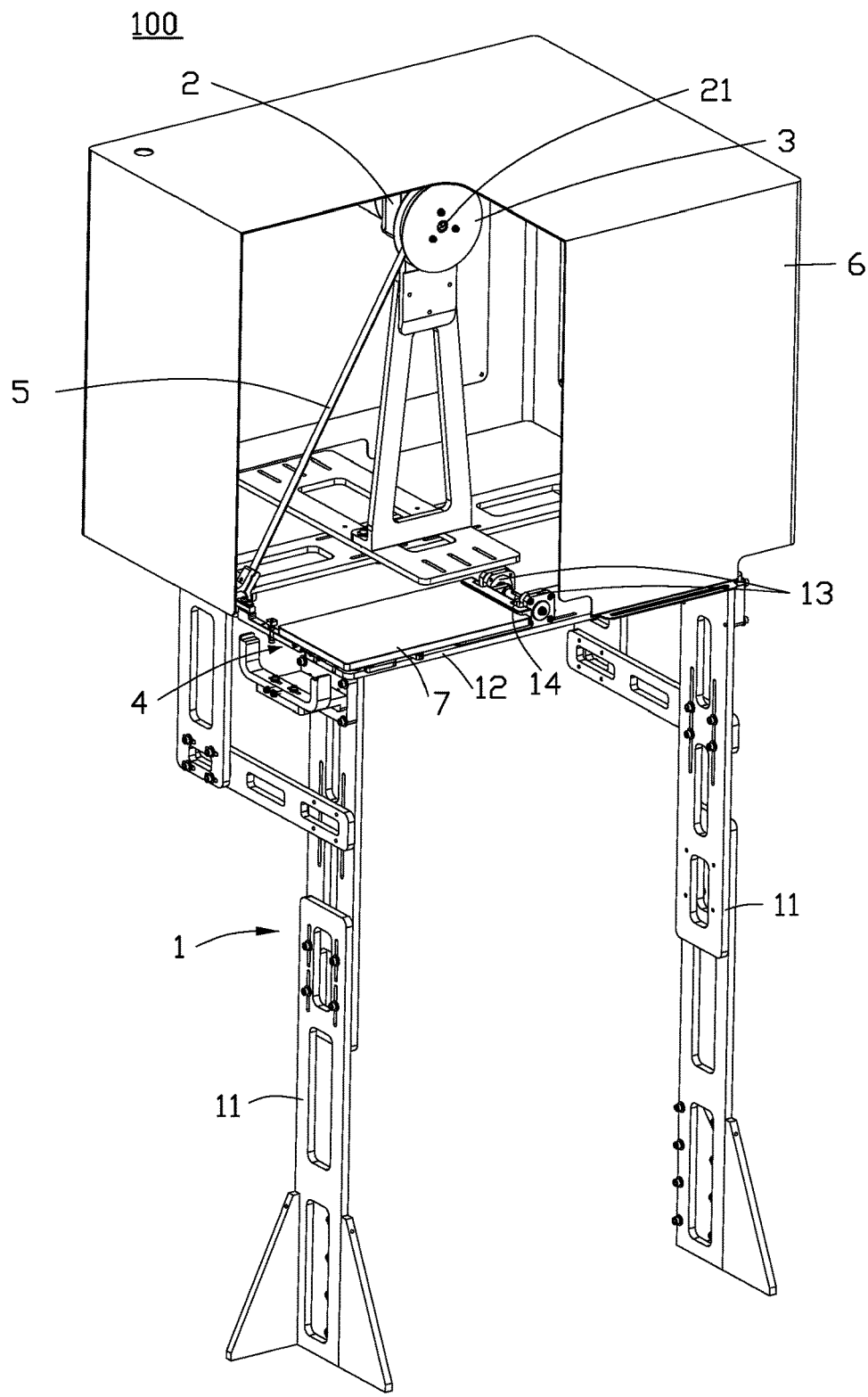
FIG. 1 is a perspective view of an exemplary embodiment of an automatic turnover device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

With reference to FIG. 1, an automatic turnover device 100 includes a support frame 1, a motor 2, a pulley 3, a holding assembly 4, a belt 5, and a cover 6.

The support frame 1 includes a pair of legs 11, a cross member 12, a pair of pivot mounts 13, and a pivot shaft 14. The legs 11 are spaced apart from each other. The cross member 12 extends between upper ends of the legs 11. The pivot mounts 13 are spaced apart from each other and mounted on the cross member 12. The pivot shaft 14 is mounted between the pivot mounts 13.

The motor 2 is secured to the cross member 12 of the support frame 1. The motor 2 has an output shaft 21.

The pulley 3 is mounted on the output shaft 21 of the motor 2.

Figure 2:
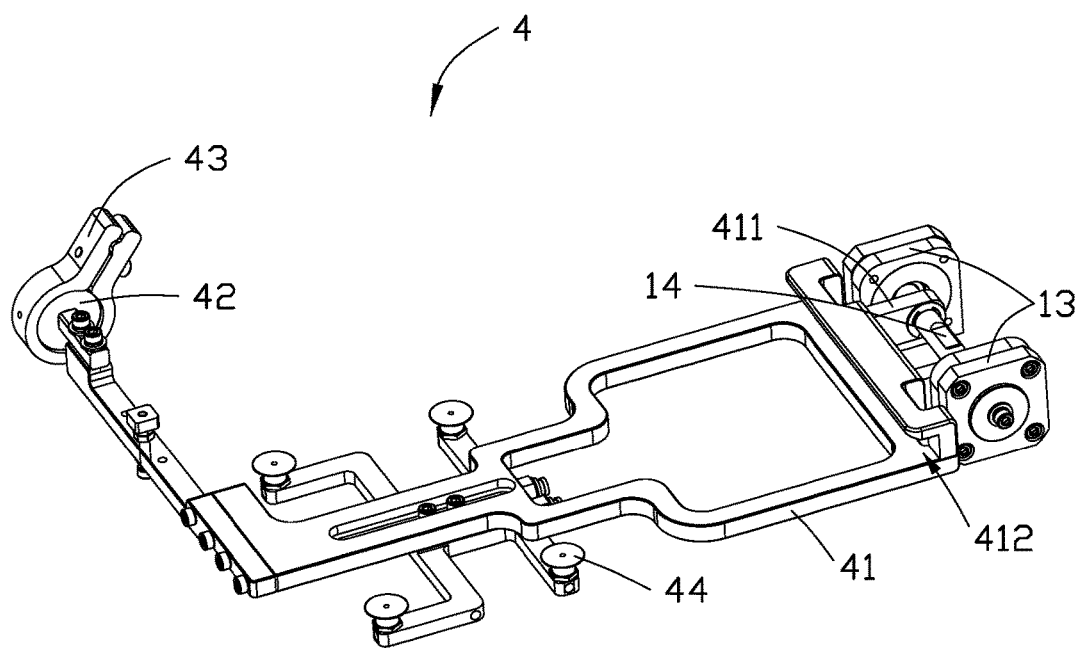
FIG. 2 is a perspective view of a holding assembly of the automatic turnover device of FIG. 1.

The holding assembly 4 is pivotally connected to the support frame 1. With further reference to FIG. 2, the holding assembly 4 includes a bracket 41, a bearing 42, a clamping block 43, and at least one suction cup 44. The bracket 41 has a proximal side, a distal side, a connection portion 411, and a holding channel 412. The connection portion 411 extends from the proximal side of the bracket 41 and is pivotally connected to the pivot shaft 14 between the pivot mounts 13 of the support frame 1 such that the bracket 41 can pivot about the pivot shaft 14. The holding channel 412 is formed in the proximal side of the bracket 41 adjacent the connection portion 411. The bearing 42 has an inner race mounted on the distal side of the bracket 41 and an outer race secured to the clamping block 43. The suction cup 44 is mounted on the bracket 41. The holding assembly 4 is configured to hold an object 7, such as a workpiece or a fixture holding a workpiece. The object 7 can be stably held on the bracket 41 by the holding channel 412 and the suction cup 44. In the present exemplary embodiment, four suction cups 44 are symmetrically arranged on the diagonals of the bracket 41.

The belt 5 has one end attached to the pulley 3 and another end attached to the clamping block 43 of the holding assembly 4.

The cover 6 houses the motor 2 to prevent danger to personnel during operation of the motor 2.

Figure 3:
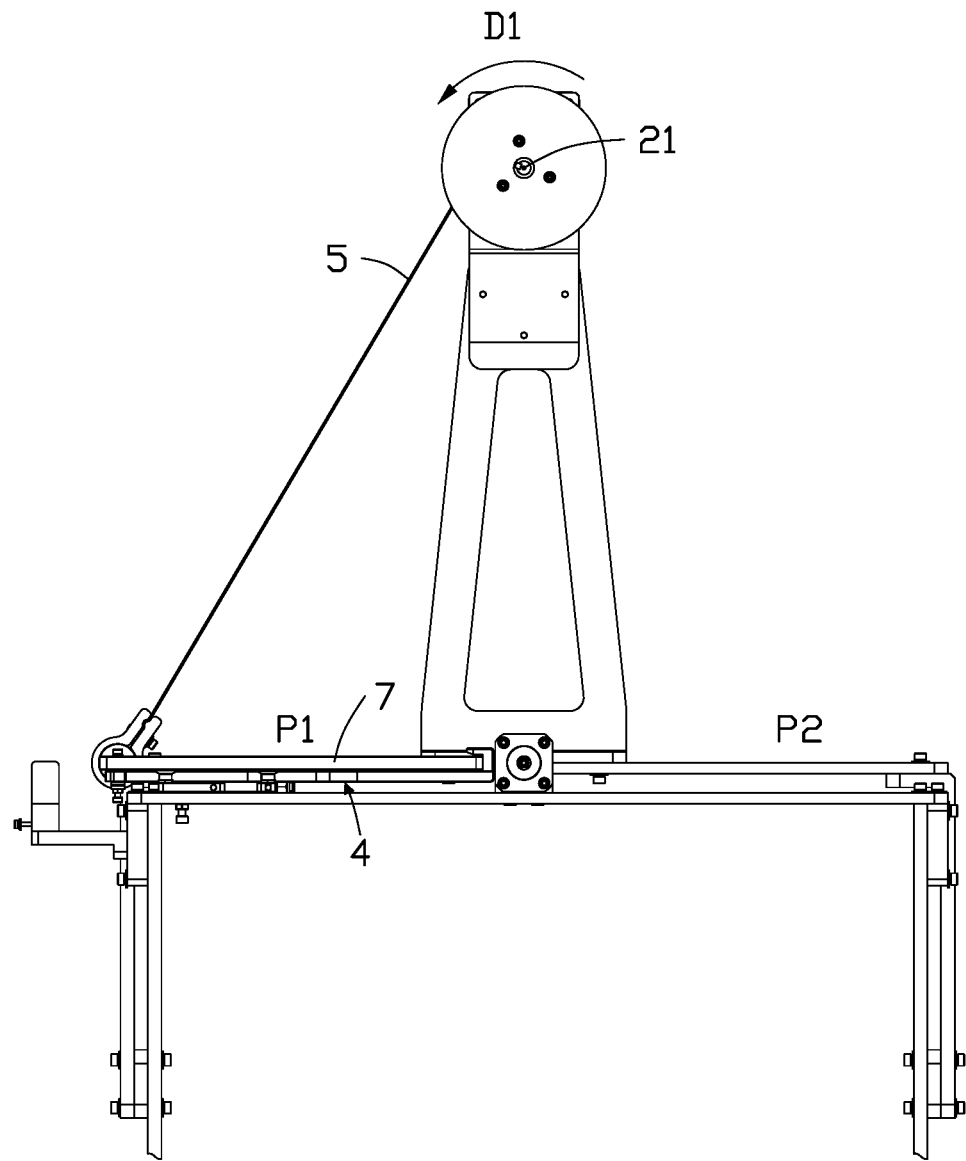
FIGS. 3 to 6 are operational front views of the automatic turnover device of FIG. 1, showing the holding assembly being turned over.
Figure 4:
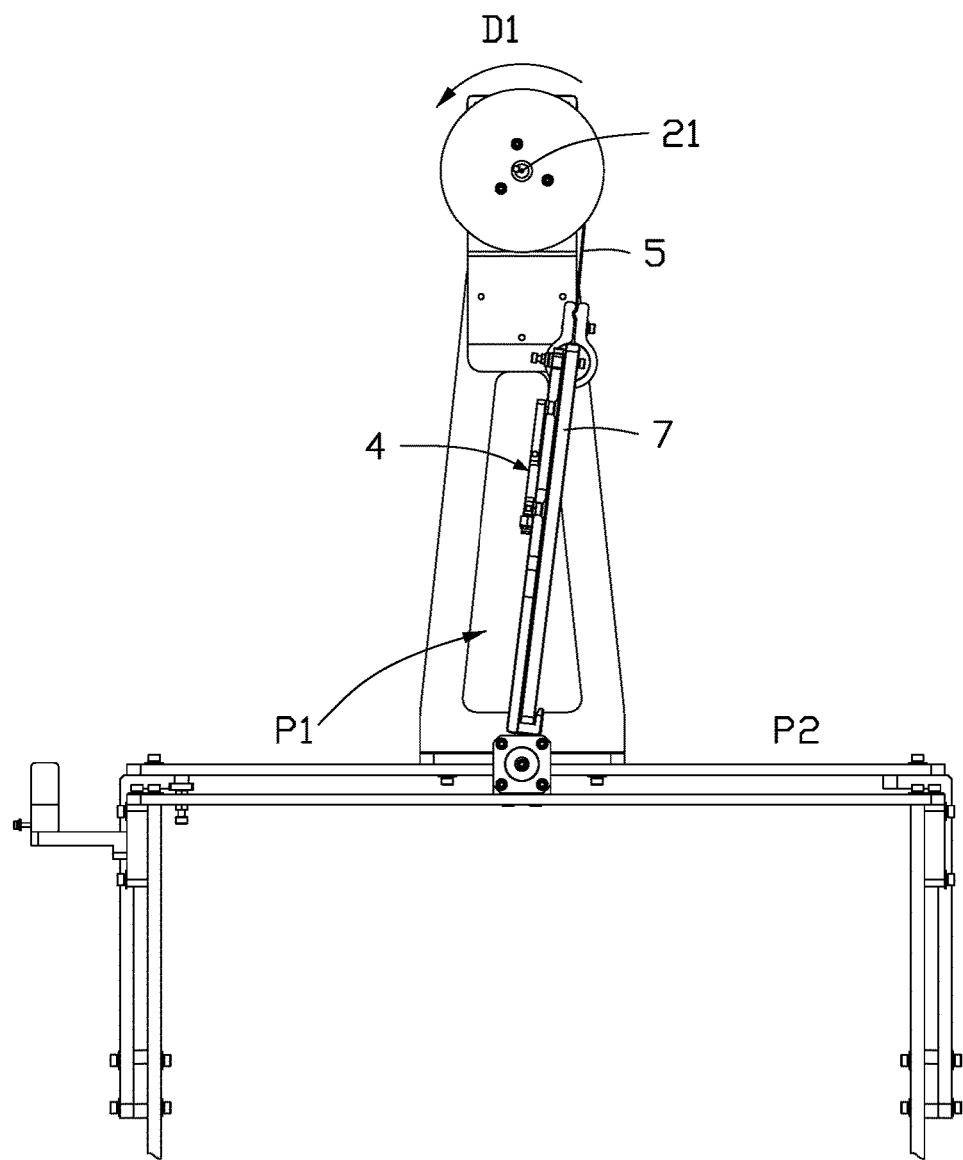
Figure 5:
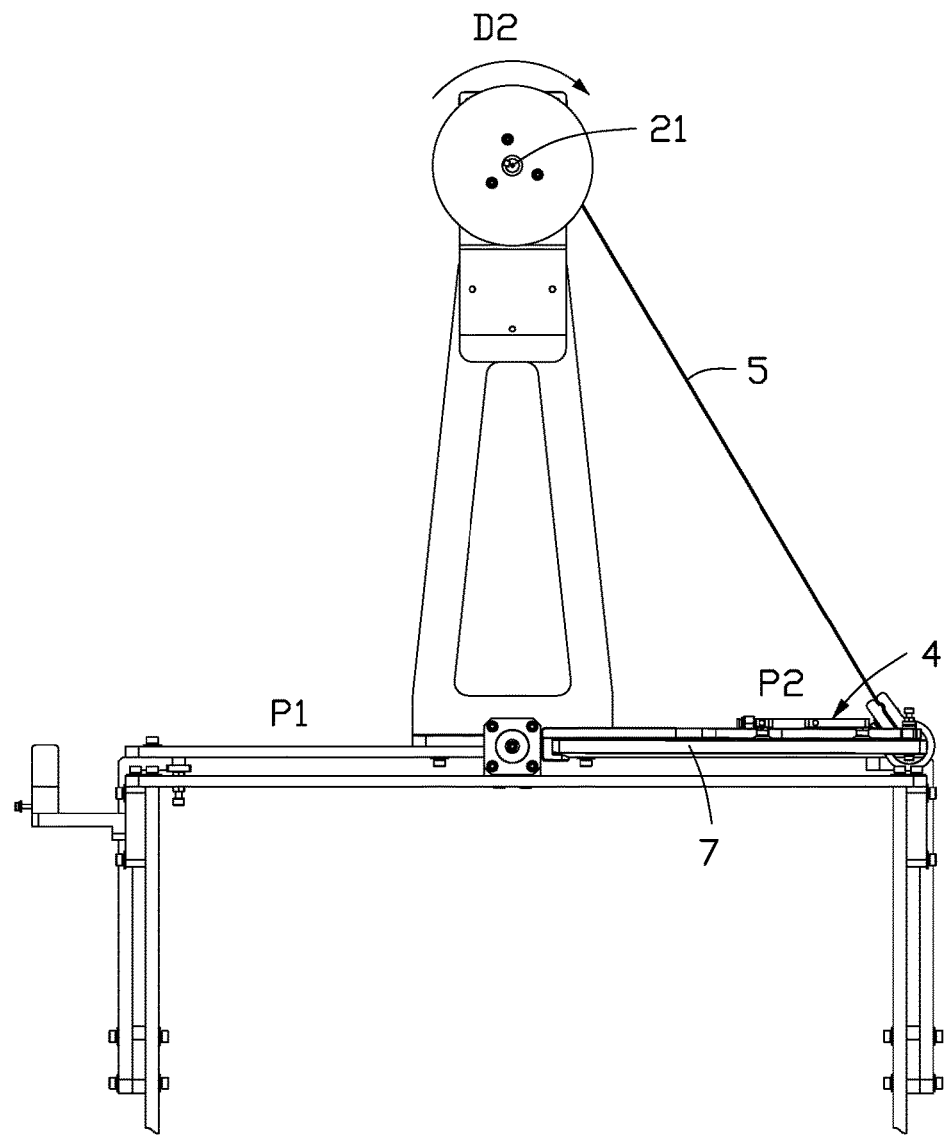
Figure 6:
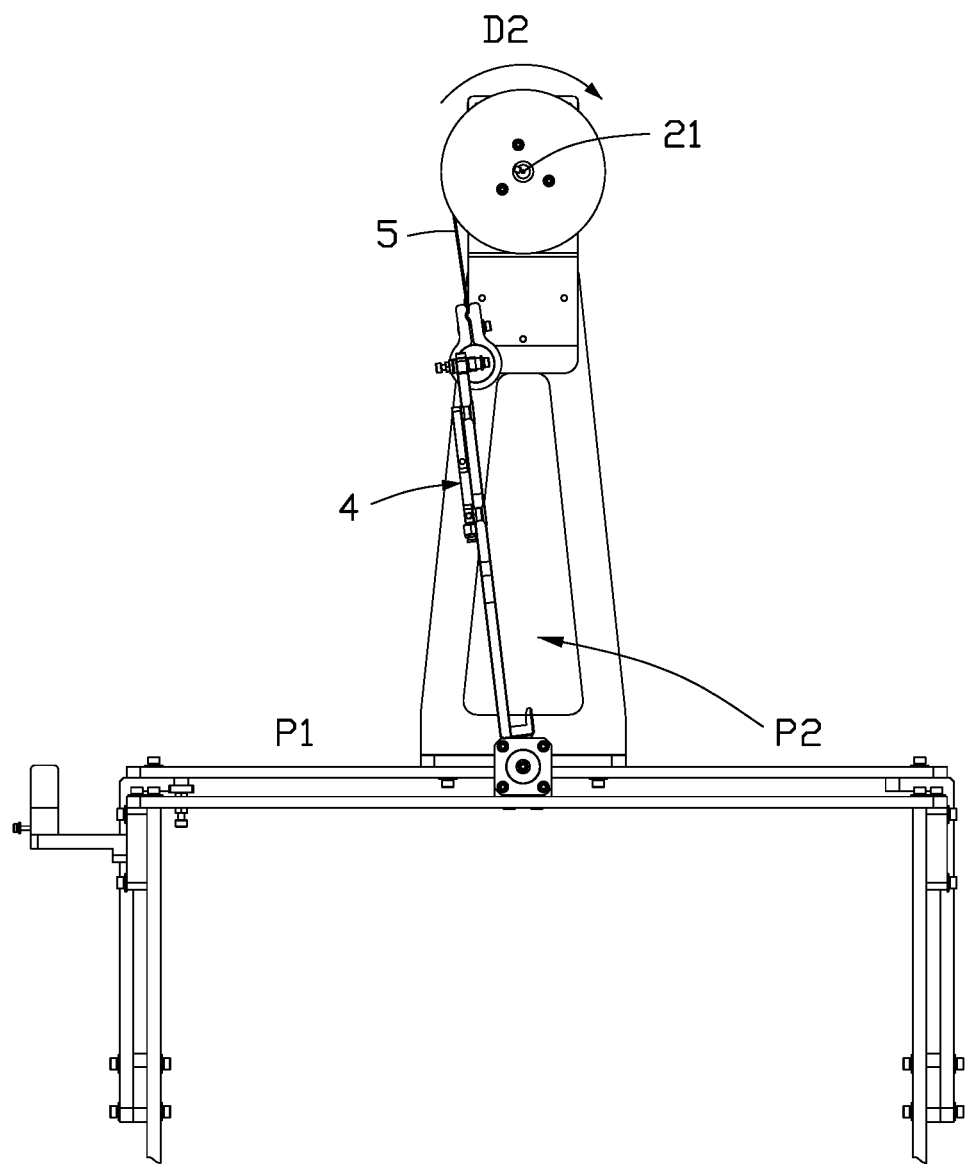

In use, the automatic turnover device 100 is mounted on a conveyor (not shown). The object 7 is transported to the bracket 41 of the holding assembly 4 by the conveyor. With reference to FIGS. 3 and 4, the motor 2 is operated to rotate the output shaft 21 in a first direction D1 to tighten the belt 5, and thus to pivot the holding assembly 4 about the pivot shaft 14 of the support frame 1. The holding assembly 4 pivots more than 90° from a first horizontal position P1, and a center of gravity of the holding assembly 4 is moved. With further reference to FIG. 5, the motor 2 is operated to rotate the output shaft 21 in a second direction D2 to release the belt 5 such that the holding assembly 4 continuously pivots to a second horizontal position P2, simply due to its weight. Therefore, the object 7 held on the bracket 41 of the holding assembly 4 is automatically turned over, and the turned over object 7 is transported to a subsequent station (not shown) by the conveyor. With reference to FIGS. 5 and 6, the motor 2 is operated to rotate the output shaft 21 in the second direction D2 to tighten the belt 5, and thus to pivot the holding assembly 4 more than 90° from the second horizontal position P2. With further reference to FIG. 3, the motor 2 is operated to rotate the output shaft 21 in the first direction D1 to release the belt 5 such that the holding assembly 4 continuously pivots back to the first horizontal position P1 due to its weight. Therefore, the holding assembly 4 can hold another object 7. In the present exemplary embodiment, the first direction D1 is counterclockwise and the second direction D2 is clockwise.

The automatic turnover device 100 has the advantages of simple structure, low manufacturing costs, and small size.

The exemplary embodiments shown and described above are only examples. Many details are often found in the art such as the other features of a manufacturing device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. An automatic turnover device comprising:
   a support frame;
   a motor secured to the support frame, and the motor having an output shaft;
   a pulley mounted on the output shaft of the motor;
   a holding assembly pivotally connected to the support frame; and
   a belt having one end attached to the pulley and another end attached to the holding assembly;
   wherein the motor is operated to rotate the output shaft in a first direction to tighten the belt and then is operated to rotate the output shaft in a second direction to release the belt, such that a center of gravity of the holding assembly is moved and the holding assembly pivots relative to the support frame from a first horizontal position to a second horizontal position.

2. The automatic turnover device of claim 1, wherein the holding assembly has a bracket, and the bracket has:
   a distal side;
   a proximal side pivotally connected to the support frame; and
   a holding channel formed in the proximal side.

3. The automatic turnover device of claim 2,
   wherein the holding assembly has a bearing having an inner race mounted on the distal side of the bracket and an outer race secured to a clamping block; and
   wherein the another end of the belt attached to the clamping block.

4. The automatic turnover device of claim 2, wherein the holding assembly has at least one suction cup mounted on the bracket.

5. The automatic turnover device of claim 3, wherein the holding assembly has at least one suction cup mounted on the bracket.

6. The automatic turnover device of claim 1,
   wherein the support frame has:
   a pair of legs; and
   a cross member extending between upper ends of the legs; and
   wherein the motor is secured to the cross member of the support frame.

7. The automatic turnover device of claim 2,
   wherein the support frame has:
   a pair of legs; and
   a cross member extending between upper ends of the legs; and
   wherein the motor is secured to the cross member of the support frame.

8. The automatic turnover device of claim 3,
   wherein the support frame has:
   a pair of legs; and
   a cross member extending between upper ends of the legs; and
   wherein the motor is secured to the cross member of the support frame.

9. The automatic turnover device of claim 4,
   wherein the support frame has:
   a pair of legs; and
   a cross member extending between upper ends of the legs; and
   wherein the motor is secured to the cross member of the support frame.

10. The automatic turnover device of claim 5,
    wherein the support frame has:
    a pair of legs; and
    a cross member extending between upper ends of the legs; and
    wherein the motor is secured to the cross member of the support frame.

11. The automatic turnover device of claim 6,
    wherein the support frame has a pair of pivot mounts spaced apart from each other and mounted on the cross member; and
    wherein the holding assembly is mounted between the pivot mounts.

12. The automatic turnover device of claim 7,
    wherein the support frame has a pair of pivot mounts spaced apart from each other and mounted on the cross member; and
    wherein the holding assembly is mounted between the pivot mounts.

13. The automatic turnover device of claim 8,
    wherein the support frame has a pair of pivot mounts spaced apart from each other and mounted on the cross member; and
    wherein the holding assembly is mounted between the pivot mounts.

14. The automatic turnover device of claim 9,
    wherein the support frame has a pair of pivot mounts spaced apart from each other and mounted on the cross member; and
    wherein the holding assembly is mounted between the pivot mounts.

15. The automatic turnover device of claim 10,
    wherein the support frame has a pair of pivot mounts spaced apart from each other and mounted on the cross member; and
    wherein the holding assembly is mounted between the pivot mounts.

16. The automatic turnover device of claim 1, further comprising a cover housing the motor.

17. The automatic turnover device of claim 2, further comprising a cover housing the motor.

18. The automatic turnover device of claim 3, further comprising a cover housing the motor.

19. The automatic turnover device of claim 4, further comprising a cover housing the motor.

20. The automatic turnover device of claim 5, further comprising a cover housing the motor.

* * * * *